United States Patent [19]  [11] Patent Number: 4,958,078
Becchetti  [45] Date of Patent: Sep. 18, 1990

[54] LARGE APERTURE ION-OPTICAL LENS SYSTEM

[75] Inventor: Fred D. Becchetti, Ann Arbor, Mich.

[73] Assignee: The University of Michigan, Ann Arbor, Mich.

[21] Appl. No.: 293,694

[22] Filed: Jan. 5, 1989

[51] Int. Cl.$^5$ ............................................. H01J 37/10
[52] U.S. Cl. ........................ 250/396 R; 250/396 ML
[58] Field of Search ........... 250/396 R, 396 ML, 398, 250/492.3

[56] References Cited

U.S. PATENT DOCUMENTS

| | | | |
|---|---|---|---|
| 2,219,405 | 10/1940 | Sukumlyn | 250/396 ML |
| 2,941,077 | 6/1960 | Marker | 250/396 R |
| 3,201,631 | 8/1965 | Gale et al. | 250/396 R |
| 3,371,206 | 2/1968 | Takizawa | 250/398 |
| 3,621,327 | 11/1971 | Hashmi | 250/396 R |
| 4,063,098 | 12/1977 | Enge | 250/398 |
| 4,684,808 | 8/1987 | Plics et al. | 250/396 ML |
| 4,687,940 | 8/1987 | Ward et al. | 250/398 |

Primary Examiner—Bruce C. Anderson
Attorney, Agent, or Firm—Rohm & Monsanto

[57] ABSTRACT

A lens system for a beam of energetic ions employs a focusing element in combination with a defocusing element. In a preferred embodiment, the focusing element is in the form of an electromagnetic lens, such as a solenoid, through which is propagated the beam of energetic ions. Also in the beam path is provided a defocusing element which also may be in the form of an electromagnetic element, such as a solenoid, or a magnetic element, such as a magnetic dipole. Alternatively, an electrostatic defocusing element may be employed in the practice of the invention. In a magnetic embodiment, defocusing is achieved by propagating the beam of energetic ions around the exterior of the defocusing element. The focusing element may be of the electrostatic variety, such as a radial an electric field lens. In other embodiments, a further focusing element, or a further defocusing element may be arranged in the beam path.

14 Claims, 1 Drawing Sheet

LARGE APERTURE ION-OPTICAL LENS SYSTEM

BACKGROUND OF THE INVENTION

This invention relates generally to ion-optical lens systems, and more particularly, to a large aperture ion-optical lens system wherein spherical and chromatic aberrations, as well as other errors, are corrected with the use of a defocusing lens system, which may be of the magnetic or electrostatic type, arranged in combination with a focusing lens system.

Ion focusing in most ion-optical systems utilizes magnetic or electric dipoles or quadrupoles, or electrostatic grids. Characteristically, conventional dipoles and quadrupoles are not characterized by azimuthal symmetry, and therefore have a relatively poor aspect ratio in the form of opening aperture-to-length. Accordingly, these known system elements impose severe restraints upon the angular acceptance (f/#) of the ion-optical system.

In addition to the poor aspect ratio and constrained angular acceptance, the mechanical construction and orientation of such dipole and quadrupole lens systems renders alignment thereof to be difficult. Moreover, such systems do not possess simple optical properties, such as simple ion orbits, ion focusing, and aberrations.

Another type of system which has been used in the art includes grid-type lenses which are arranged in the vicinity of the ion beam path. Such grid-type systems, however, introduce unwanted background noise since some of the ions will strike the grid. Accordingly, such systems are not acceptable for many applications.

It is, therefore, an object of this invention to provide an ion-optical system having a large aperture.

It is another object of this invention to provide a system having a large aperture for controlling a beam of energetic ions.

It is also an object of this invention to provide a simple and economical large aperture ion-optical system which is compact.

It is a further object of this invention to provide a large aperture lens system which can be corrected for spherical aberrations.

It is additionally an object of this invention to provide a large aperture lens system which can be corrected for chromatic aberrations.

It is yet a further object of this invention to provide a large aperture lens system which provides improvement in resolution and efficiency (i.e., collecting power).

It is also another object of this invention to greater than provide a large aperture lens system which operates with reduced background noise.

It is yet an additional object of this invention to provide a large aperture lens system which can be employed in multiple applications, such as mass spectrometers, gas analyzers, leak detectors, ion implantation devices, ion sources, ion accelerators, mass separators, ion spectrometers, ion microprobes, radiation therapy, electron microscopes, ion-optical devices, etc.

It is still another object of this invention to provide a large aperture lens system which does not employ wire grids or metal foils.

It is a yet further object of this invention to provide a large aperture lens system which is useful in focusing energetic ions in the range of approximately between tens of keV to tens of MeV.

It is also a further object of this invention to provide a large aperture lens system which is operable in a non-dispersive, achromatic mode.

It is additionally another object of this invention to provide a large aperture ion-optical lens system which has high angular acceptance and collecting power.

A still further object of this invention is to provide a large aperture ion-optical lens system which can focus positive and negative ions simultaneously.

An additional object of this invention is to provide a large aperture ion-optical lens system which provides full symmetry around the optical axis.

Another object of this invention is to provide a lens system which can provide precise focusing of energetic ions having energy in the range of approximately 10 to greater than 500 MeV, and which is useful in cancer therapy.

A yet further object of this invention is to provide a lens system which can operate in special modes, such as with large angular magnification to provide a sharp focus at a specific location, such as the site of a tumor, while minimizing radiation of adjacent tissue since the beam is greatly defocused elsewhere.

SUMMARY OF THE INVENTION

The foregoing and other objects are achieved by this invention which provides a lens system for an energy beam, illustratively one formed of energetic ions. In accordance with the invention, a focusing element is arranged to receive the energy beam within its effective range, and cause same to be focused. A defocusing element is arranged in a predetermined axial relationship with the focusing element, also for receiving the energy beam within its effective range, and focusing same. The focusing and defocusing elements are arranged in a predetermined axial relationship with respect to one another.

In a highly advantageous embodiment of the invention, the focusing element is of the electromagnetic type, preferably in the form of a solenoid. In such an embodiment, the energy beam is propagated through the interior of the solenoid where its propagation path is affected by the magnetic fields. In other embodiments, the focusing element may be of the electrostatic type. Preferably, such an electrostatic focusing element may be a radial electric field lens.

In accordance with a further embodiment of the invention, the defocusing element may also be of the electromagnetic type, and may be in the form of a solenoid. In such an embodiment, the energy beam is propagated in a path which is exterior to the solenoid and within the effective magnetic field range thereof. Alternatively, the defocusing element may be in the form of a magnetic dipole, such as a permanent magnet dipole. In other embodiments, the defocusing element may be in the form of an electrostatic defocusing element, such as an electric field lens.

In accordance with a further aspect of the invention, a lens system for a beam of energetic ions employs an electromagnetic focusing element having an interior defined therewithin through which is propagated the beam of energetic ions. There is further provided a defocusing element having a beam path substantially along which is propagated the beam of energetic ions. The electromagnetic focusing element and the focusing element are arranged in a predetermined relationship with respect to one another and to the beam of energetic ions.

In one embodiment of the invention, the defocusing element is in the form of an electromagnetic device, such as a defocusing solenoid. In such an embodiment, the beam of energetic ions is propagated around the exterior of the defocusing solenoid. Alternatively, the defocusing element may be formed of an electrostatic defocusing element arranged in the vicinity of the beam of energetic ions. Such an electrostatic defocusing element may be in the form of a radial electric field lens or electric dipole lens.

As indicated, the subject invention pertains to an ion lens design which is arranged using simple magnetic and electrostatic focusing and defocusing elements. Each such element has azimuthal symmetry, and therefore, simple ion-optical properties. The system is relatively uncomplicated in terms of construction and alignment, and in certain embodiments consists of (1) solenoidal or axial dipole magnetic focusing ($F_M$) and defocusing ($D_M$) elements combined with (2) radial-field electrostatic elements for focusing ($F_E$) or defocusing ($D_E$). A significant aspect of the invention is the use of new types of defocusing elements based on solenoids, or axially aligned magnetic or electrostatic dipoles.

As is known, a magnetic solenoid provides an axial magnetic field which provides ion focusing. The magnet may be of a conventional coiled yoke/solenoid, a dipole magnet, or a superconducting solenoid. Superconducting solenoids are particularly useful in systems where very energetic ions, such as nuclear reaction products, are focused. Solenoids have been used extensively for focusing electrons, and more recently, for heavier ions. They are characterized by a large aperture-to-focal length ratio, and therefore have high collecting power (i.e., fast f/#). Moreover, solenoids have full symmetry around the optical axis ($\Phi=2\pi$), and positive and negative ions can be focused simultaneously if desired.

In the present state of the art, solenoid lenses have always been considered to be focusing (F) elements, and therefore one cannot easily correct for aberrations or make achromatic systems using another solenoid, as such would require a defocusing (D) element. The combinations of focusing and defocusing elements of the present invention, include without limitation, FD, DFD, FDF, and others.

In accordance with a highly advantageous aspect of the present invention, a lens system is provided which employs a radial electric field lens for $D_E$, combined with a magnetic solenoid lens $F_M$ to yield a large-aperture ion lens which can be corrected for spherical aberrations, and in some cases, chromatic aberrations. In a preferred embodiment, which is not subject to the high voltage requirement of the electrostatic radial field lens, a defocusing magnetic element $D_M$ is employed. Although it is well known that solenoidal fields are always focusing if the ions are propagated inside the solenoid, ions which pass on the outside of the solenoid are defocused with a definable negative focal length. Such defocusing, however, produces a measure of aberrations. In addition, a similar defocusing effect can be achieved using a permanent magnetic dipole or electric dipole oriented on axis.

In addition to the foregoing, superconducting solenoids and electric field lenses are low in cost and light in weight relative to conventional steel-yoked magnetic systems. The light weight characteristic allows the lens to be moved easily relative to the patient, illustratively a cancer therapy patient. In a large bore magnetic lens system, the patient could even be placed inside part of the magnet. By moving the magnet and varying the magnet current one can maintain or move the focal point to allow a desired distribution of the ion beam radiation dose. Neutron and gamma-ray therapy could be accomplished by inserting appropriate converters and sensors surrounding the patient.

BRIEF DESCRIPTION OF THE DRAWING

Comprehension of the invention is facilitated by reading the following detailed description, in conjunction with the annexed drawing, in which.

DETAILED DESCRIPTION

Figure 1:
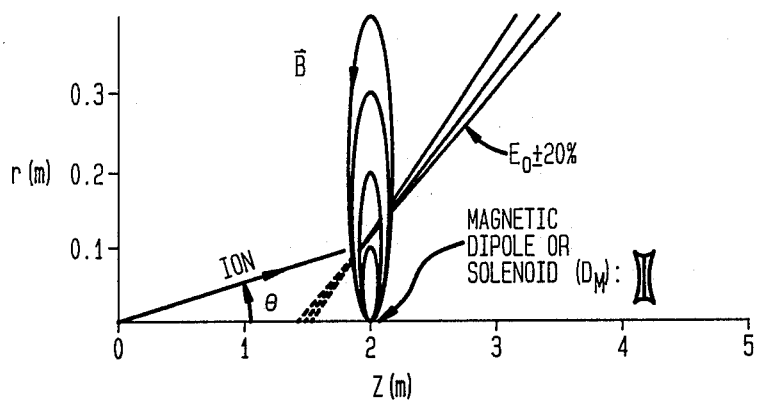
FIG. 1 is a ray tracing plot which illustrates the optical properties of a defocusing, axially symmetric, magnetic dipole.

FIG. 1 is a ray tracing plot which illustrates the optical properties of a defocusing axially-symmetric magnetic element. The magnetic element may be a solenoid, or as shown, an axial magnetic dipole. The figure shows typical ray orbits for $^8Li^{3+}$ ions, $E_0=120$ MeV, $\Theta=3°$. The quantity "r" is the ion's distance from the axis.

The lens of FIG. 1 exhibits both spherical and chromatic aberrations. Chromatic aberration (i.e., momentum dispersion), as is the case for a conventional solenoid lens, is proportional to the square of the ion's magnetic rigidity, but is of opposite sign. Hence, by the proper choice of its location and strength, one can use this element to cancel, at least in the first order, the momentum dispersion of the primary focusing element ($F_M$ or $F_E$). However, as is the case in the practical designs of most optical systems, only partial compensation may be achieved as a result of the spherical aberration and higher-order dispersion terms.

The new $D_M$ element together with the previously described $F_M$, $F_E$, and $D_E$ lenses can be combined with suitable field profiles and lens separations to produce axially symmetric, compact, large-aperture, well-corrected, and even semi-achromatic ion-optical lens systems. Although the axial components of the $D_M$, $F_E$, and $D_E$ elements are intrusive for central ($\Theta=0°$) paraxial rays, they can be located to minimize background, etc. In many transmission devices, they may serve as the incident beam blocking aperture. The other intrusive elements are the lens support structures (not shown) and power/current leads (not shown). Since the intrusive lenses are generally used as correction elements they can be much smaller and lighter than the main focusing element. Also, the magnetic defocusing element can serve as the grounded electrode for a radial electric field lens, and hence serve a dual function ($D_M D_E$ or $D_M F_E$). Of course, mechanical forces between magnetic elements can be large and must be considered.

Figure 2:
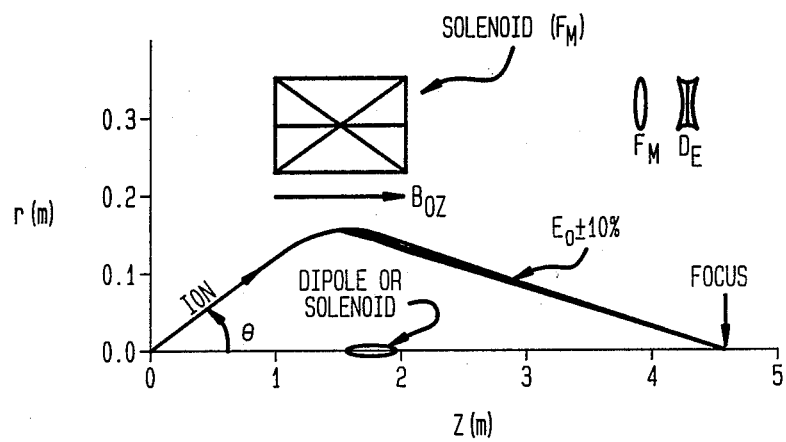
FIG. 2 is a ray tracing plot which illustrates the optical properties of an ion-optical lens configuration ($F_M D_M$) using a defocusing magnetic element (solenoid or axial magnetic dipole) to form a semi-achromatic system for $\Theta=7°$, over an energy range of ca. $\pm 10\%$.

FIG. 2 is a ray tracing plot which illustrates the optical properties of an ion-optical lens configuration ($F_M D_M$) which uses a defocusing magnetic element shown on the axis (r=0) in the form of a solenoid or axial magnetic dipole. This arrangement is shown to produce a semi-achromatic system for $\infty = 7°$, over an energy range of the chromatic aberration ±10%.

The system represented by FIG. 2 can be very compact when formed by a solenoid ($F_M$) with a radial electric field lens ($D_E$ or $F_E$) and defocusing ($D_M$) solenoid (or magnetic dipole) located at the lens exit. As shown in the figure, the lens system can be corrected for spherical aberrations, and if a suitable high field for $D_M$ is used, can result in an achromatic system. This rather unique system also has a very large collecting power due to the $\Phi = 2\pi$ symmetry.

Figure 3:
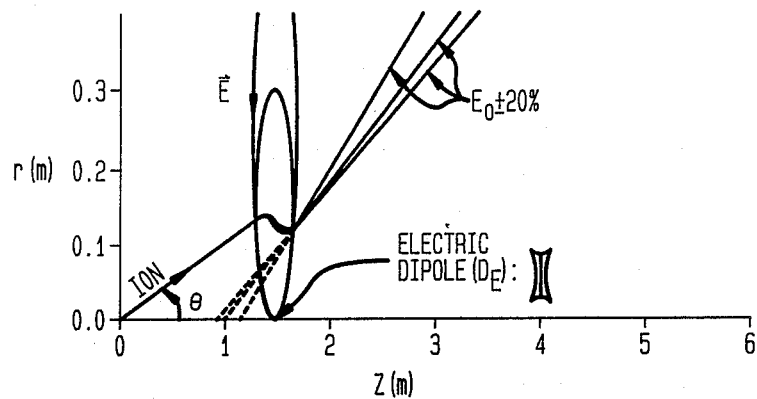
FIG. 3 is a ray tracing plot which illustrates the optical properties of a defocusing, axially symmetric electric dipole, and shows typical ray orbits for $^8Li^{3+}$, for $E_0=120$ MeV, and $\Theta=5°$.

FIG. 3 is a ray tracing plot which illustrates the optical properties of a defocusing axially symmetric electric dipole. The figure shows typical ray orbits for $^8Li^{3+}$, for $E_0 = 120$ MeV, and $\Theta = 5°$. The system of this figure represents an extension of the concept of the magnetic defocusing lens, as applied to an axially aligned electric dipole.

It is evident from FIG. 3 that the ions which pass on the outside of the lens element are defocused ($D_E$). Although this can be achieved with a defocusing radial electric field lens, the spherical aberration and chromatic aberration terms are different since the $_E(r)$ gradients are different. This permits more flexibility in compensating the spherical and chromatic aberrations from the primary focusing element.

Figure 4:
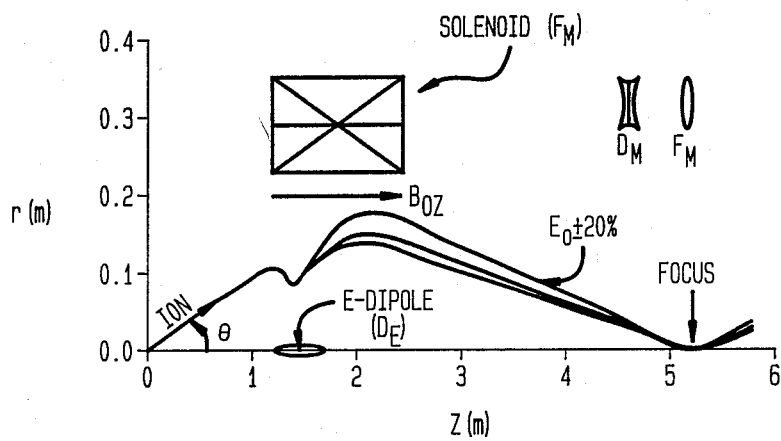
FIG. 4 is a ray tracing plot which illustrates the optical properties of an ion-optical lens configuration ($D_E F_M$) using a defocusing axial electric dipole, as shown in FIG. 3, to form a semi-achromatic system ($\Theta=5°$) over an ion energy range of ca. $\pm 20\%$.

FIG. 4 is a ray tracing plot which illustrates the optical properties of an ion-optical lens configuration using a defocusing axial electric dipole, of the type shown in FIG. 3, to form a semi-achromatic system ($\Theta = 5°$) over an ion range of ca. ±20%. The system shown in this figure has optical properties which are similar to those obtained using the magnetic defocusing element shown in FIG. 2. Of course, person of skill in the art having knowledge of the teaching herein can configure the size and shape of the electrodes which would be required to be optimized to accommodate reasonable field gradients, illustratively on the order of 20 to 50 KV/cm.

The ion lens system of the present invention achieves an improvement in collecting efficiency by a factor on the order of between 10 and 100. Thus, for example, a mass spectrometer based upon the present lens system would have greater sensitivity, and an ion-beam implantation system would have higher intensity. Such devices would possess unique optical properties since the lens can be easily designed for variable dispersion and magnification, while retaining simple optical properties. In a nuclear reaction-product spectrometer, the 10 to 100 times increase in efficiency (solid angle) combined with the simple optical properties offers a significant advantage over present devices.

Although the invention has been described in terms of specific embodiments and applications, persons skilled in the art can, in light of this teaching, generate additional embodiments without exceeding the scope or departing from the spirit of the claimed invention. Accordingly, it is to be understood that the drawing and description in this disclosure are proffered to facilitate comprehension of the invention, and should not be construed to limit the scope thereof.

What is claimed is:

1. A lens system for an energy beam, the lens system comprising:
    focusing means for receiving the energy beam and focusing same toward an axis which extends through said focusing means and which defines a general direction of propagation of the energy beam; and
    defocusing means having an exterior and an interior, and arranged in a predetermined axial relationship with respect to said focusing means, the energy beam being propagated along a path which substantially surrounds said exterior of said defocusing means, for defocusing the energy beam away from said axis.

2. The lens system of claim 1 wherein said focusing means comprises an electromagnetic focusing element.

3. The lens system of claim 2 wherein said electromagnetic focusing element comprises a solenoid.

4. The lens system of claim 1 wherein focusing means comprises an electrostatic focusing element.

5. The lens system of claim 4 wherein said electrostatic focusing element comprises a radial electric field lens.

6. The lens system of claim 1 wherein said defocusing means comprises an electromagnetic defocusing element wherein said axis extends through an interior thereof and the energy beam is propagated substantially parallel to said axis, along the exterior of said electromagnetic defocusing element.

7. The lens system of claim 6 wherein said electromagnetic defocusing element comprises a solenoid.

8. The lens system of claim 1 wherein there is provided a further focusing element arranged in axial relationship with said focusing means and said defocusing means.

9. The lens system of claim 1 wherein said defocusing means comprises an electrostatic defocusing element.

10. The lens system of claim 1 wherein said defocusing means comprises a magnetic dipole.

11. A lens system for a beam of energetic ions, the lens system comprising:
    electromagnetic focusing means having an interior defined therein through which is propagated the beam of energetic ions; and
    electromagnetic defocusing means for defocusing the beam of energetic ions, said electromagnetic defocusing means having a beam path arranged substantially around the exterior thereof, and along which is propagated the beam of energetic ions, said electromagnetic focusing means and said electromagnetic defocusing means having a predetermined spatial relationship with respect to one another and to the beam of energetic ions.

12. The lens system of claim 11 wherein said electromagnetic defocusing means comprises a defocusing solenoid.

13. The lens system of claim 11 wherein said defocusing means comprises electrostatic defocusing means in the vicinity of which is propagated the beam of energetic ions.

14. The lens system of claim 13 wherein said electrostatic defocusing means comprises a radial electric field lens.

* * * * *